United States Patent [19]

Greenwood

[11] Patent Number: 4,655,091

[45] Date of Patent: Apr. 7, 1987

[54] ROTATIONAL MOVEMENT

[75] Inventor: John C. Greenwood, Harlow, England

[73] Assignee: International Standard Electric Corporation, New York, N.Y.

[21] Appl. No.: 594,166

[22] Filed: Mar. 28, 1984

[30] Foreign Application Priority Data

May 10, 1983 [GB] United Kingdom ............... 8312776

[51] Int. Cl.[4] .......................................... G01M 15/00
[52] U.S. Cl. ................................... 73/862.08; 338/5; 338/114
[58] Field of Search ..................... 338/5, 2, 68, 114; 340/686, 870.38; 73/118, 862.08; 323/353, 354, 367, 369

[56] References Cited

U.S. PATENT DOCUMENTS

| 2,403,952 | 7/1976 | Ruge | 73/862.35 |
| 3,161,844 | 12/1964 | Kabell | 338/2 |
| 3,314,035 | 4/1967 | Sanchez | 338/68 |
| 3,329,023 | 7/1967 | Kurtz et al. | 73/862.65 X |
| 3,417,322 | 12/1968 | Fenner . | |
| 3,492,513 | 1/1970 | Hollander, Jr. et al. . | |
| 3,836,796 | 9/1974 | Solomon et al. | 73/777 X |

Primary Examiner—Jerry W. Myracle
Attorney, Agent, or Firm—T. L. Peterson; J. S. Christopher

[57] ABSTRACT

A transducer responsive to rotational movement comprises a support member on which a shaft is rotatably mounted. Relative movement between the member and the shaft is sensed by flexure of a strip of a piezo-resistive mateial. Typically, the strip is facribed from signle crystal silicon.

9 Claims, 3 Drawing Figures

ROTATIONAL MOVEMENT

BACKGROUND OF THE INVENTION

This invention relates to electromechanical transducers, and in particular to a transducer wherein the active element comprises a flexible body of a piezo-resistive material.

SUMMARY OF THE INVENTION

According to one aspect of the invention there is provided a transducer for detecting relative rotational movement between first and second bodies, wherein the sensor element of the transducer comprises a flexible strip of a single crystal piezo-resistive material so disposed as to be flexed by the rotational movement.

According to another aspect of the invention there is provided a transducer responsive to rotational movement, including a support member having a shaft rotatably mounted thereon, and a flexible transducer element formed from a single crystal piezo-resistive material wherein the transducer element is coupled between the shaft and the support member such that relative rotational motion therebetween causes flexure of the element and a corresponding change in its electrical sensitivity.

BRIEF DESCRIPTION OF THE DRAWINGS

In the accompanying drawings which illustrate exemplary embodiments of the present invention.

DESCRIPTION OF THE PREFERRED EMBODIMENT

Figure 1:
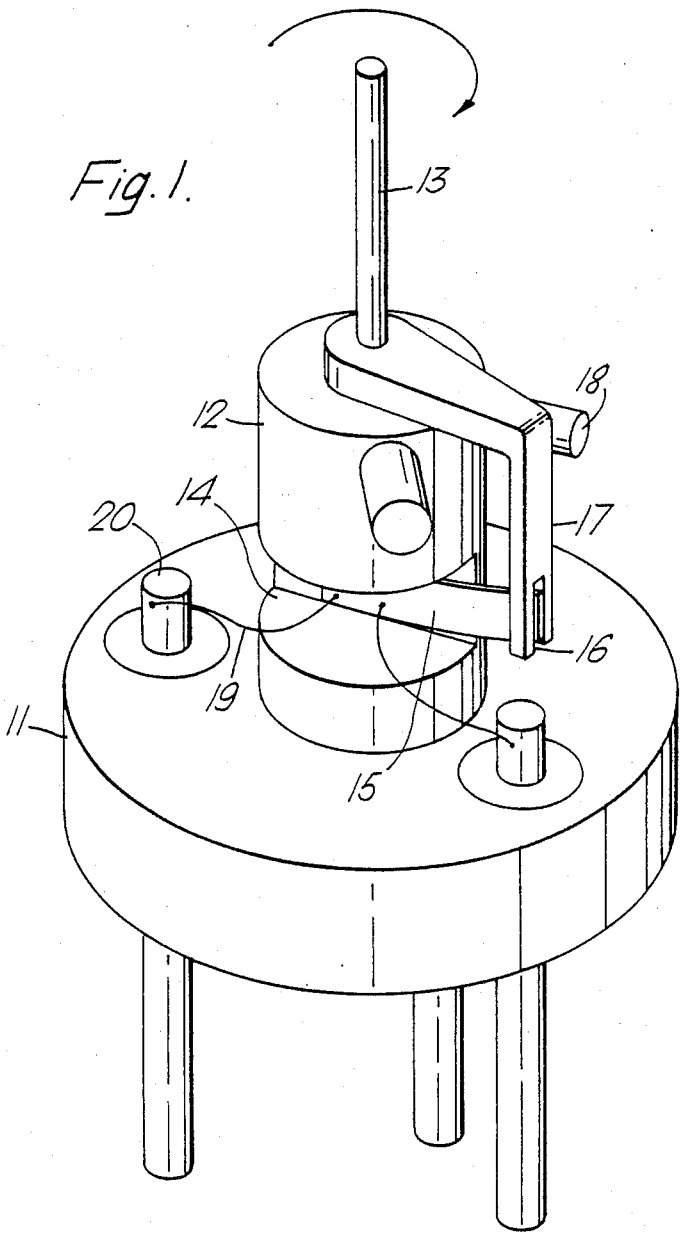
FIG. 1 is a perspective view of a transducer assembly.

Referring to FIG. 1, the transducer assembly includes a support member 11 having a cylindrical portion 12 extending therefrom and on which a shaft 13 is rotatably mounted. The cylindrical portion 12 has a cutaway portion defining a slot 14 for receiving a transducer element comprising a flexible single crystal strip 15 of a piezo-resistive material including but not limited to silicon. Typically, this material is silicon.

The free end of the element 15 engages a slot 16 in a rigid arm 17 mounted on the shaft 13 such that rotation of the shaft 13 causes corresponding bending, and a consequent resistive change, of the element 15. Excessive bending of the element 15 may be prevented by the provision of a limit stops 18 against which the arm 17 abuts at the limits of its travel. External connection to the element 15 may be provided via leads 19 which connect to contact pins 20 mounted on the support member 11.

Figure 2:
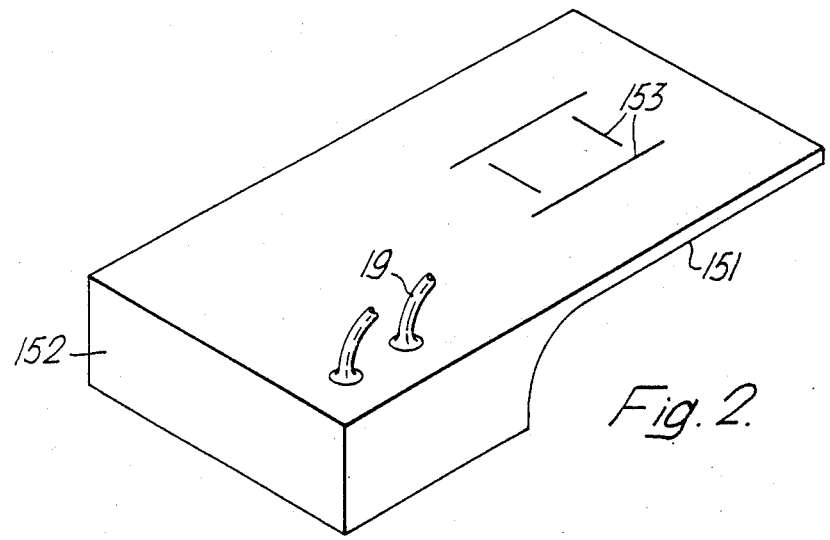
FIG. 2 is a perspective view of a transducer element of the assembly of FIG. 1.

FIG. 2 shows the detail of a transducer element for use in the assembly of FIG. 1. It will be clear that the particular configuration of this element is given by way of example only and that other transducer structures could be employed. As shown in FIG. 2, the element 15 comprises a relatively thin flexible portion 151 supported on and formed integral with a relatively thick support portion 152 whereby the element, in use, is mounted. Flexure of the portion 151 is indicated by changes in the values of an array of piezo-resistors 153 formed e.g. as doped regions in the flexible portion. Electrical coupling between the resistors 153 and the input/output leads 19 may be effected by metallization or diffusion tracks (not shown). Typically, the element 15 also incorporates an amplifier (not shown) whereby the resistance changes in the resistors 153 due to flexure of the portion 151 are amplified to provide an output signal.

Figure 3:
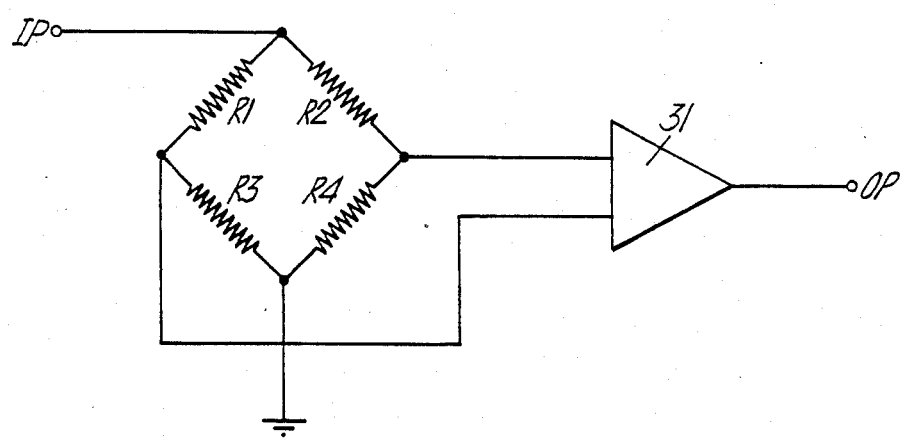
FIG. 3 shows the equivalent circuit of the transducer assembly of FIG. 1.

Referring now to FIG. 3, the transducer element 15 incorporates a resistor network comprising typically a Wheatstone bridge arrangement of power piezo-resistors R1 to R4 (153). The values of resistors R1 to R4 are such that the bridge is balanced in the unstressed condition of the element 15. Flexure of the element 15 changes the values of the resistors R1 to R4, typically by up to 5%, thus producing a corresponding imbalance of the bridge. This imbalance signal may then be amplified, e.g. by an amplifier 31, preferably formed integral with the element, to provide an output signal indicative of the degree of rotation of the shaft 13. Preferably, all the resistors R1 to R4 of the network are formed on the element 15 thus providing automatic compensation for temperature changes.

Advantageously, the transducer element 15 is formed from single silicon crystal, e.g. by masking and selective etching from a silicon wafer. Typically, the wafer is processed to form the resistor. Element 15 may be conventional except for its cantilever shape. The front mask defines the boundaries between the elements and the back mask defines the support regions 152 of these elements. The wafer may then be etched first from the back face thereof to define the flexible portion 151 and then from the front to separate the elements. We have found that conventional etches provide a very uniform cast which can maintain the thickness tolerance of the flexible portion 151 to within a micron. Finally, leads 19 are bonded to contact the device regions of the element and the element is mounted by the portion 152 in a transducer assembly.

The transducer assembly may be employed to provide a remote indication of relative rotation between adjacent bodies. Such an arrangement may be employed, e.g. in an aircraft or a submarine to provide confirmation of the correct degree of movement of a control surface in response to a navigational instruction. Other applications include use as a high quality potentiometer which is substantially wear free.

What is claimed is:

1. A transducer for detecting relative rotational movement comprising:

a first body;

a second body rotatably coupled to said first body permitting relative rotation between said first and second bodies;

a single crystal piezo-resistive flexible strip coupled at one end to said first body and at an opposing end to said second body, relative rotation of said first and second bodies causing a flexure of said strip, wherein said single crystal piezo-resistive flexible strip is particularly characterized by comprising a plurality of integral piezo-resistors formed therein, each one of said piezo-resistors being formed within said strip at a distinguishable location on one surface of said strip and said piezo-resistors forming a two dimensional array on said surface of said thinned portion of said strip;

means disposed on said one surface for coupling said plurality of piezo-resistors into an electrical network; and means for generating an amplified output signal from said electrical network formed from said plurality of piezo-resistors, whereby relative rotation between said first and second bodies is transformed into said output signal.

2. The transducer of claim 1 wherein said means for generating said amplified output is an integrated circuit amplifier integrally formed within said one surface of said piezo-resistive strip and wherein said piezo-resistive strip is made of semiconductor material.

3. The transducer of claim 2 wherein said piezo-resistive flexible strip is a rectangular prismatic body, said body having a first thickened portion fixed to said first body and a thinned portion extending from said thickened portion and extending from said first body to said second body, substantially all flexure of said strip occurring within said thinned portion, said thinned portion further defining said one surface wherein said plurality of piezo-resistors are defined.

4. The transducer of claim 3 wherein said two dimensional array is a four element resistive bridge.

5. The transducer of claim 1 wherein said piezo-resistive flexible strip is a rectangular prismatic body, said body having a first thickened portion fixed to said first body and a thinned portion extending from said thickened portion and extending from said first body to said second body, substantially all flexure of said strip occurring within said thinned portion, said thinned portion further defining said one surface wherein said plurality of piezo-resistors are defined.

6. The transducer of claim 5 wherein said thinned portion of said strip is characterized by a substantially uniform thickness, tolerance of said thickness of said thinned portion being within one micron.

7. A transducer responsive to rotational movement comprising:

a support member;

a shaft rotatably mounted on said support member;

an arm fixed to said shaft and extending radially outward from the rotational coupling of said shaft to said support member, said arm having a slot defined therein;

a single crystal rectangular prismatic semiconductor strip, said strip being coupled between said shaft and support member, relative rotation of said shaft with respect to said support member causing flexure of said strip, said strip characterized by a longitudinal rectangular surface, one end of said strip being a thickened portion fixed to said support member, an opposing end of said strip being uniformly thinned to a predetermined thickness, substantially all of said flexure of said strip occurring in said thinned portion, said thinned portion extending from said thickened portion fixed to said support member radially outward to said arm, said thinned portion slidingly coupled through said slot within said arm, rotation of said arm with said shaft causing said flexure in said thinned portion of said strip; and a plurality of resistive elements forming a two dimensional array integrally formed in said surface of said thinned portion of said strip, said plurality of resistive elements being piezo-resistive and coupled to form an electrical network.

8. The transducer of claim 7 further comprising means for generating an amplified output signal from said electrical network formed by said plurality of coupled resistive elements, said means integrally formed within said same surface wherein said plurality of resistive elements are integrally formed.

9. The transducer of claim 8 wherein said predetermined thickness of said thinned portion of said strip is uniform to within one micron.

* * * * *